(12) United States Patent
Sengupta et al.

(10) Patent No.: US 10,884,551 B2
(45) Date of Patent: Jan. 5, 2021

(54) INTEGRATED GESTURE SENSOR MODULE

(71) Applicant: ANALOG DEVICES, INC., Norwood, MA (US)

(72) Inventors: Dipak Sengupta, Boxborough, MA (US); Shrenik Deliwala, Andover, MA (US); Ying Zhao, Andover, MA (US); Bruce Fried, Peabody, MA (US); William Schoppee, Medway, MA (US); Woodrow Beckford, Salisbury, NH (US)

(73) Assignee: Analog Devices, Inc., Norwood, MA (US)

( * ) Notice: Subject to any disclaimer, the term of this patent is extended or adjusted under 35 U.S.C. 154(b) by 457 days.

(21) Appl. No.: 14/276,238

(22) Filed: May 13, 2014

(65) Prior Publication Data
US 2014/0340302 A1 Nov. 20, 2014

Related U.S. Application Data

(60) Provisional application No. 61/824,165, filed on May 16, 2013.

(51) Int. Cl.
*G06F 3/042* (2006.01)
*G06F 3/01* (2006.01)

(52) U.S. Cl.
CPC ............ *G06F 3/042* (2013.01); *G06F 3/017* (2013.01); *H01L 2224/48095* (2013.01);
(Continued)

(58) Field of Classification Search
CPC ...... G06F 3/042; G06F 3/0421; G06F 3/0428; G06F 3/043; G06F 3/0433; G06F 3/033
See application file for complete search history.

(56) References Cited

U.S. PATENT DOCUMENTS 5,247,597 A 9/1993 Blacha et al.
5,289,002 A 2/1994 Tarn
(Continued)

FOREIGN PATENT DOCUMENTS

DE 19909242 A1 8/2000
EP 1 276 142 A2 1/2003
(Continued)

OTHER PUBLICATIONS

Office Action dated Jun. 17, 2014 in U.S. Appl. No. 13/560,855, filed Jul. 27, 2012 in 11 pages.
(Continued)

*Primary Examiner* — Temesghen Ghebretinsae
*Assistant Examiner* — Paras D Karki
(74) *Attorney, Agent, or Firm* — Knobbe, Martens, Olson & Bear, LLP

(57) ABSTRACT

An integrated gesture sensor module includes an optical sensor die, an application-specific integrated circuit (ASIC) die, and an optical emitter die disposed in a single package. The optical sensor die and ASIC die can be disposed in a first cavity of the package, and the optical emitter die can be disposed in a second cavity of the package. The second cavity can be conical or step-shaped so that the opening defining the cavity increases with distance from the upper surface of the optical emitter die. The upper surface of the optical emitter die may be higher than the upper surface of the optical sensor die. An optical barrier positioned between the first and second cavities can include a portion of a pre-molded, laminate, or ceramic package, molding compound, and/or metallized vias.

33 Claims, 9 Drawing Sheets

(52) U.S. Cl.
CPC ............... *H01L 2224/48145* (2013.01); *H01L 2224/48465* (2013.01); *H01L 2224/73265* (2013.01); *Y10T 29/49826* (2015.01)

(56) References Cited

U.S. PATENT DOCUMENTS

| | | | |
|---|---|---|---|
| 5,340,420 | A | 8/1994 | Ozimek et al. |
| 5,421,928 | A | 6/1995 | Knecht et al. |
| 5,500,505 | A | 3/1996 | Jones |
| 5,643,472 | A | 7/1997 | Engelsberg et al. |
| 5,907,395 | A * | 5/1999 | Schulz ............... G01B 11/002 356/139.03 |
| 6,113,835 | A | 9/2000 | Kato et al. |
| 6,335,224 | B1 | 1/2002 | Peterson et al. |
| 6,344,664 | B1 | 2/2002 | Trezza et al. |
| 6,352,880 | B1 | 3/2002 | Takai et al. |
| 6,379,988 | B1 | 4/2002 | Peterson et al. |
| 6,396,116 | B1 | 5/2002 | Kelly et al. |
| 6,489,686 | B2 | 12/2002 | Farooq et al. |
| 6,531,328 | B1 | 3/2003 | Chen |
| 6,576,867 | B1 | 6/2003 | Lu et al. |
| 6,602,430 | B1 | 8/2003 | Nally et al. |
| 6,707,161 | B2 | 3/2004 | Moon et al. |
| 6,787,916 | B2 | 9/2004 | Halahan |
| 6,825,065 | B2 | 11/2004 | Moon et al. |
| 6,861,641 | B1 | 3/2005 | Adams |
| 6,864,460 | B2 | 3/2005 | Cummings et al. |
| 6,869,231 | B2 | 3/2005 | Chiu et al. |
| 6,878,564 | B2 | 4/2005 | Silverbrook |
| 6,878,900 | B2 | 4/2005 | Corkum et al. |
| 6,915,049 | B2 | 7/2005 | Murata |
| 6,930,398 | B1 | 8/2005 | Sun et al. |
| 7,049,639 | B2 | 5/2006 | Wang et al. |
| 7,209,362 | B2 | 4/2007 | Bando |
| 7,279,343 | B1 | 10/2007 | Weaver et al. |
| 7,294,827 | B2 | 11/2007 | Tan et al. |
| 7,335,922 | B2 | 2/2008 | Plaine et al. |
| 7,348,203 | B2 | 3/2008 | Kaushal et al. |
| 7,405,487 | B2 | 7/2008 | Brand |
| 7,442,559 | B2 | 10/2008 | Auburger et al. |
| 7,485,848 | B2 | 2/2009 | Minamio |
| 7,720,337 | B2 | 5/2010 | Lu et al. |
| 7,723,146 | B2 | 5/2010 | Chow et al. |
| 7,755,030 | B2 | 7/2010 | Minamio |
| 7,777,172 | B2 | 8/2010 | Hernoult |
| 7,786,186 | B2 | 8/2010 | Patterson |
| 7,807,505 | B2 | 10/2010 | Farnworth et al. |
| 7,838,899 | B2 | 11/2010 | Chow et al. |
| 7,858,437 | B2 | 12/2010 | Jung et al. |
| 8,033,446 | B2 | 10/2011 | Wada et al. |
| 8,115,307 | B2 | 2/2012 | Toyama et al. |
| 8,378,502 | B2 | 2/2013 | Chow et al. |
| 8,399,994 | B2 | 3/2013 | Roh et al. |
| 8,466,902 | B2 | 6/2013 | Boer et al. |
| 8,531,018 | B2 | 9/2013 | Pahl |
| 8,538,215 | B2 | 9/2013 | Deliwala et al. |
| 8,601,677 | B2 | 12/2013 | Doany et al. |
| 8,604,436 | B1 * | 12/2013 | Patel ............... H03K 17/941 250/338.1 |
| 8,766,186 | B2 | 7/2014 | Kierse et al. |
| 8,779,361 | B2 | 7/2014 | Costello et al. |
| 8,779,936 | B2 | 7/2014 | Costello et al. |
| 8,822,925 | B1 | 9/2014 | Patel et al. |
| 8,975,108 | B2 | 3/2015 | Rudmann et al. |
| 9,960,328 | B2 | 5/2018 | Clark et al. |
| 10,025,047 | B1 | 7/2018 | Liu et al. |
| 2002/0021874 | A1 | 2/2002 | Giboney et al. |
| 2002/0181882 | A1 | 12/2002 | Hibbs-Brenner et al. |
| 2003/0197292 | A1 | 10/2003 | Huang |
| 2003/0219217 | A1 | 11/2003 | Wickman et al. |
| 2004/0037507 | A1 | 2/2004 | Marion et al. |
| 2005/0087522 | A1 | 4/2005 | Sun et al. |
| 2005/0135071 | A1 | 6/2005 | Wang et al. |
| 2005/0226569 | A1 | 10/2005 | Sashinaka et al. |
| 2006/0001116 | A1 | 1/2006 | Auburger et al. |
| 2006/0027479 | A1 | 2/2006 | Auburger et al. |
| 2006/0045421 | A1 | 3/2006 | Baets et al. |
| 2006/0049548 | A1 | 3/2006 | Auburger et al. |
| 2006/0126331 | A1 | 6/2006 | Chien |
| 2007/0222041 | A1 | 9/2007 | Weng et al. |
| 2007/0284549 | A1 | 12/2007 | Mizuo et al. |
| 2007/0291490 | A1 * | 12/2007 | Tajul ............... H01L 33/647 362/294 |
| 2008/0074401 | A1 | 3/2008 | Chung et al. |
| 2008/0079019 | A1 | 4/2008 | Huang et al. |
| 2008/0157252 | A1 | 7/2008 | Cheng et al. |
| 2009/0011522 | A1 | 1/2009 | Drennan et al. |
| 2009/0014857 | A1 | 1/2009 | Hufgard |
| 2009/0046144 | A1 | 2/2009 | Tuttle |
| 2009/0070727 | A1 | 3/2009 | Solomon |
| 2009/0075092 | A1 * | 3/2009 | Varaprasad ............ H01L 31/18 428/428 |
| 2009/0134481 | A1 | 5/2009 | Sengupta |
| 2009/0189177 | A1 | 7/2009 | Lee et al. |
| 2009/0213262 | A1 | 8/2009 | Singh et al. |
| 2009/0218588 | A1 | 9/2009 | Panaccione et al. |
| 2009/0226130 | A1 | 9/2009 | Doany et al. |
| 2009/0269006 | A1 | 10/2009 | Ishikawa et al. |
| 2010/0019393 | A1 | 1/2010 | Hsieh et al. |
| 2010/0187557 | A1 | 7/2010 | Samoilov et al. |
| 2010/0200998 | A1 | 8/2010 | Furuta et al. |
| 2010/0244217 | A1 | 9/2010 | Ha et al. |
| 2010/0259766 | A1 * | 10/2010 | Wiese ............... H01L 25/167 356/614 |
| 2010/0327164 | A1 | 12/2010 | Costello et al. |
| 2011/0024899 | A1 | 2/2011 | Masumoto et al. |
| 2011/0062572 | A1 | 3/2011 | Steijer et al. |
| 2011/0176765 | A1 | 7/2011 | Lee |
| 2011/0204233 | A1 | 8/2011 | Costello et al. |
| 2011/0254763 | A1 * | 10/2011 | Lee et al. ............... 345/157 |
| 2012/0027234 | A1 | 2/2012 | Goida |
| 2012/0287443 | A1 * | 11/2012 | Lin ............... G06F 3/0421 356/622 |
| 2012/0313204 | A1 | 12/2012 | Haddad et al. |
| 2013/0012276 | A1 * | 1/2013 | Coffy ............... G01S 7/4813 455/575.1 |
| 2013/0032388 | A1 | 2/2013 | Lin et al. |
| 2013/0082951 | A1 * | 4/2013 | Tanaka ............... G06F 3/041 345/173 |
| 2013/0147727 | A1 * | 6/2013 | Lee et al. ............... 345/173 |
| 2013/0230273 | A1 | 9/2013 | Doscher et al. |
| 2013/0285185 | A1 | 10/2013 | Park et al. |
| 2013/0292706 | A1 * | 11/2013 | Costello ............... H01L 31/167 257/82 |
| 2013/0292786 | A1 | 11/2013 | Sengupta |
| 2013/0327931 | A1 | 12/2013 | Hsu et al. |
| 2014/0027867 | A1 | 1/2014 | Goida et al. |
| 2014/0340302 | A1 | 11/2014 | Sengupta et al. |
| 2015/0187608 | A1 | 7/2015 | Ganesan et al. |
| 2015/0270305 | A1 | 9/2015 | Hayashi et al. |
| 2015/0378013 | A1 | 12/2015 | Bikumandla et al. |
| 2016/0013223 | A1 | 1/2016 | Chang et al. |
| 2016/0068387 | A1 | 3/2016 | Nakanishi |
| 2016/0124166 | A1 | 5/2016 | Braunisch et al. |
| 2016/0276503 | A1 | 9/2016 | Kasano |

FOREIGN PATENT DOCUMENTS

| | | |
|---|---|---|
| WO | WO 2001/068460 A2 | 9/2001 |
| WO | WO 2007/005636 A2 | 1/2007 |

OTHER PUBLICATIONS

Office Action dated Jun. 19, 2015 in U.S. Appl. No. 13/462,604, filed May 2, 2012 in 15 pages.
Notice of Allowance dated Oct. 25, 2016 in U.S. Appl. No. 14/945,255, filed Nov. 11, 2015 in 14 pages.
Office Action dated Sep. 3, 2014 in U.S. Appl. No. 13/462,604, filed May 2, 2012 in 15 pages.

* cited by examiner

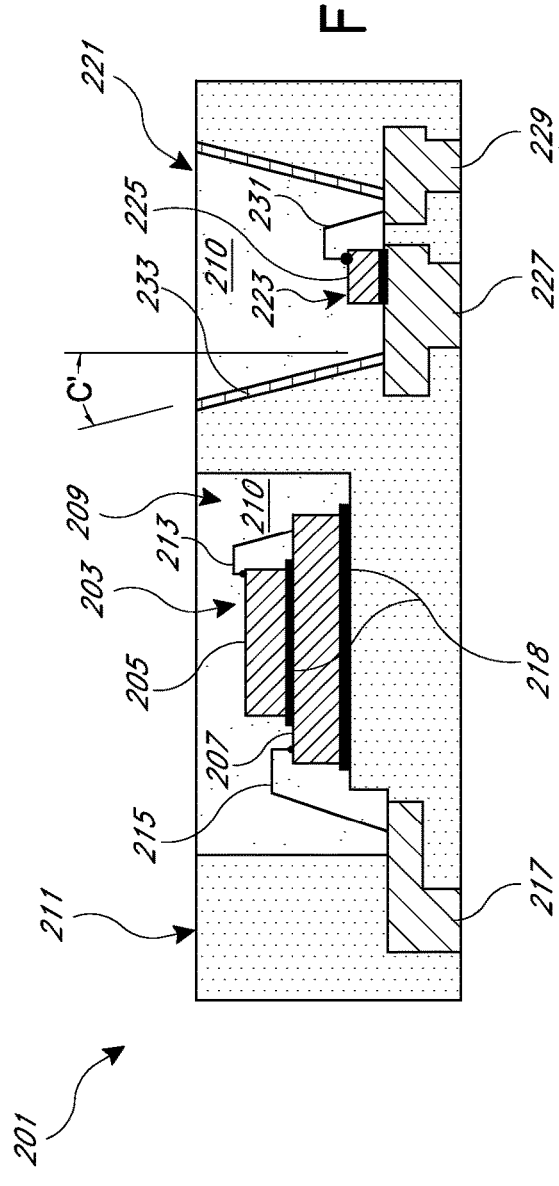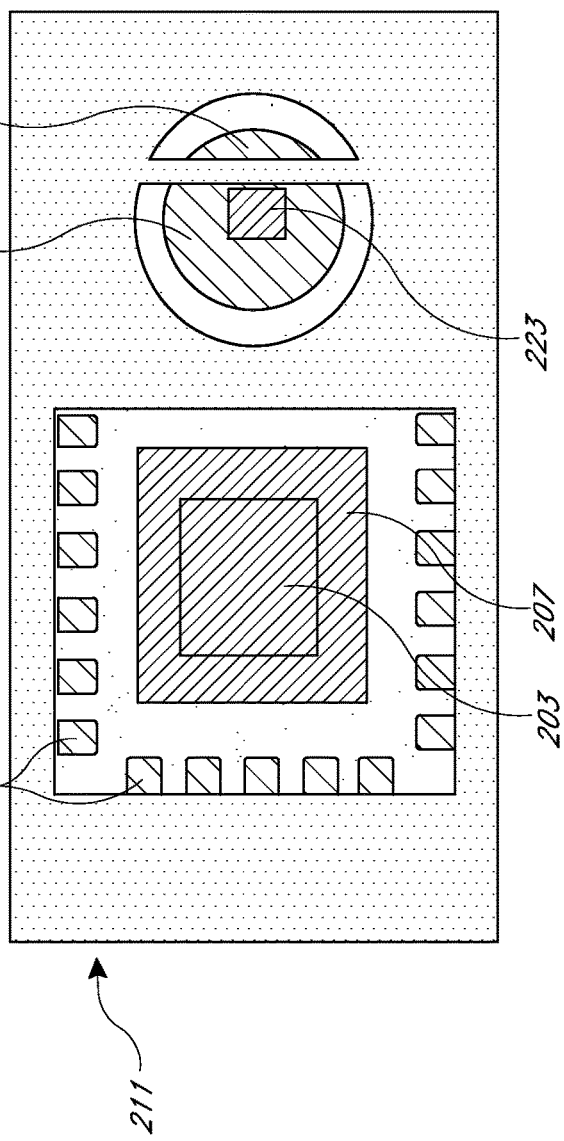

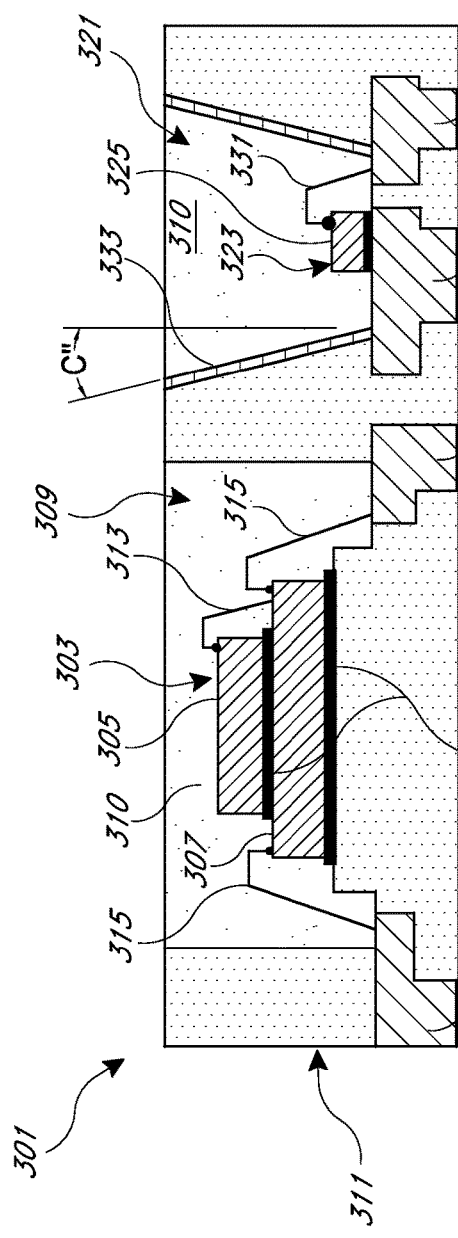
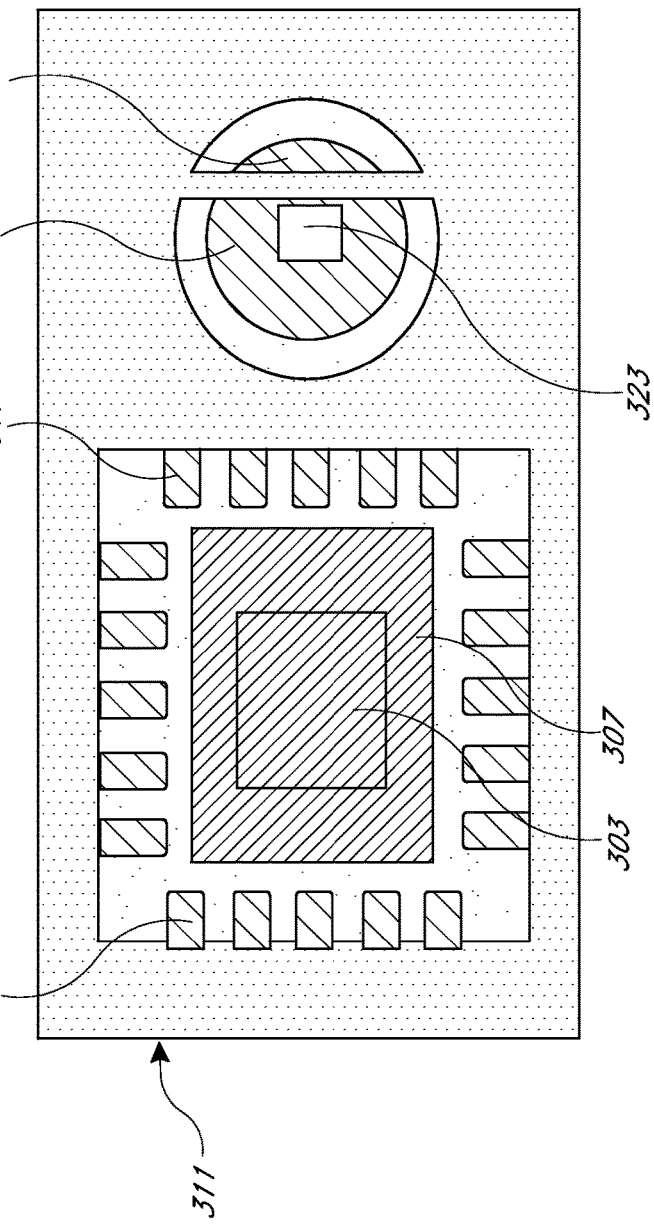
FIG. 3A
FIG. 3B

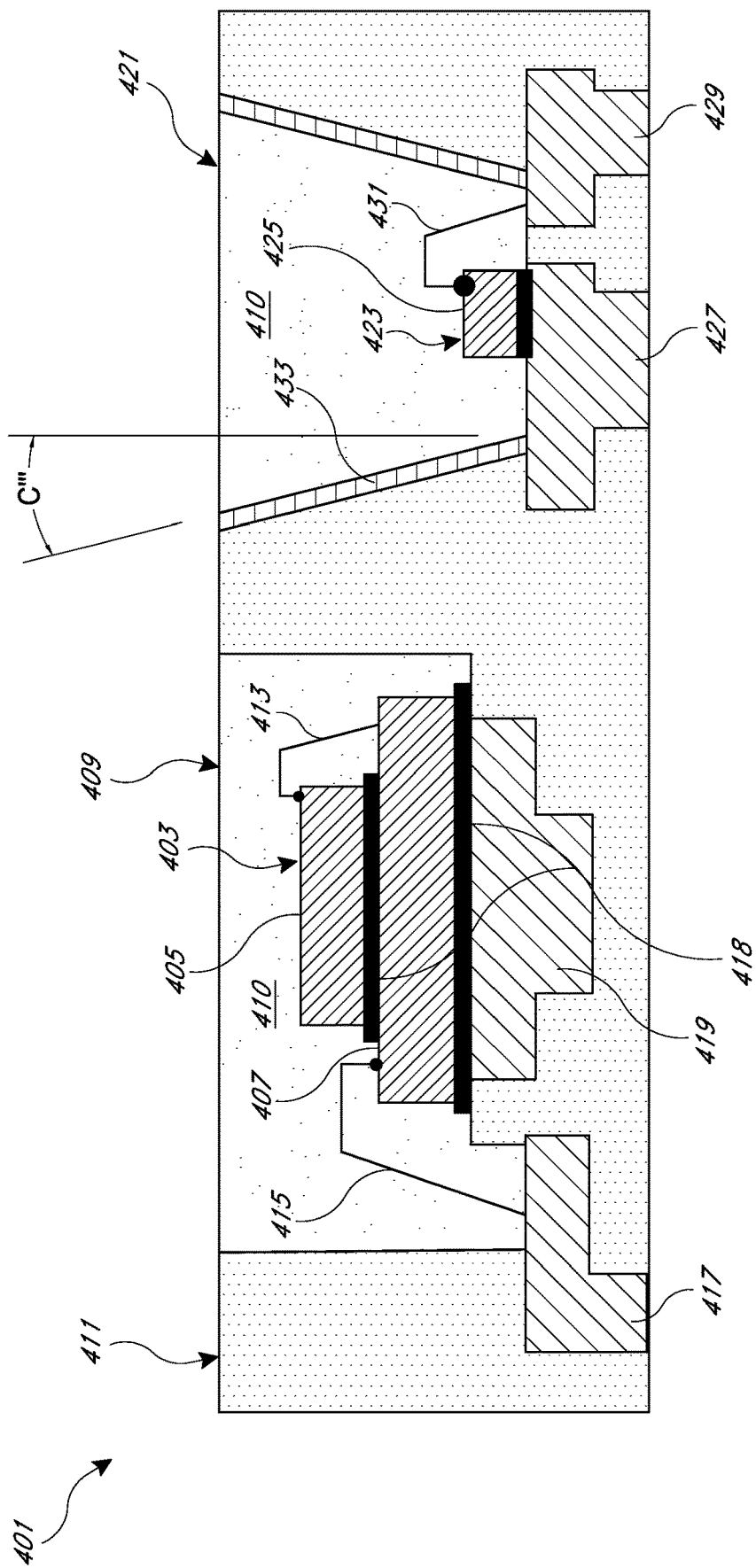

INTEGRATED GESTURE SENSOR MODULE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

This invention relates to gesture sensor modules, and packaging therefor.

Description of the Related Art

Gesture sensors may be used to detect movement of an object, for example a user's hand. Such detection can be processed, for example, allowing a user to provide input to an electronic device by making certain gestures. Gesture sensors can be used in a wide variety of fields such as consumer electronics, healthcare, or telecommunications. Components for gesture sensing can include an optical emitter, an optical sensor die, and an associated application-specific integrated circuit (ASIC). The ASIC may be configured to process the output signal from the optical sensor die.

With increasing emphasis on miniaturization, it is desirable to arrange an optical emitter, optical sensor, and ASIC closely together. In such arrangements, however, there may be risk of light pollution or cross-talk, in which some light from the optical emitter is detected by the adjacent optical sensor before being reflected by a user's hand prematurely. Such cross-talk can decrease the performance of the assembly. Accordingly, there is a need for arrangements to minimize space occupied by an optical emitter, optical sensor, and ASIC, while reducing the risk of cross-talk between the emitter and the sensor.

SUMMARY

Disclosed herein is a gesture sensor module comprising: an optical emitter die having an emitter surface; an optical sensor die having a sensor surface facing upwards; and a package housing the optical emitter die and the optical sensor die in separate cavities.

In some embodiments, the sensor surface can be higher than the emitter surface. In some embodiments, wherein the package can comprise an optical barrier positioned laterally between the optical emitter die and the optical sensor die, and the optical barrier, the emitter surface, and the sensor surface can be configured such that less than about 5% of light emitted from the emitter surface is reflected from the cover glass to the sensor surface. In some embodiments, the sensor surface can be between 0.25 mm and 0.75 mm higher than the emitter surface. In some embodiments, the sensor surface can be about 0.75 mm higher than the emitter surface. In some embodiments, the package can comprise an optical barrier positioned laterally between the optical emitter die and the optical sensor die. In some embodiments, the assembly can be configured to be positioned beneath a cover glass. In some embodiments, the package can comprise an opening over the emitter surface, where the opening has a conical shape, such that a width of the opening increases with distance from the emitter surface. In some embodiments, the surface of the opening can be reflective. In some embodiments, the surface of the opening can be coated with a reflective metal layer. In some embodiments, the conical surface of the opening can define an angle with the emission axis of between about 1 and 30 degrees. In some embodiments, the emitter surface can be laterally spaced from the sensor surface by between 0.25 mm and 3 mm. In some embodiments, the gesture sensor module can further comprise an ASIC die in electrical communication with and positioned beneath the optical sensor. In some embodiments, the package can comprise at least one of: laminate, ceramic, and pre-molded polymer. In some embodiments, the total package height can be between 1 and 1.4 mm. In some embodiments, the total package height can be about 1.15 mm to 1.25 mm. The gesture module can be integrated with a larger electronic device, such as a mobile computing device and/or an electronic touch screen.

Further disclosed herein is a gesture sensor module comprising: a package comprising first and second cavities; an optical emitter die positioned in the first cavity; an optical sensor die positioned in the second cavity; and an optical barrier positioned laterally between the optical emitter die and the optical sensor die.

In some embodiments, the package can comprise a pre-molded or ceramic package, and wherein the optical barrier comprises a portion of the pre-molded or ceramic package. In some embodiments, the optical barrier can comprise a molding compound. In some embodiments, the optical barrier can comprise a metallized via in a laminate or pre-molded plastic cover. In some embodiments, an emitter surface of the optical emitter die can be lower than an upper surface of the optical sensor die. The gesture module can be integrated with a larger electronic device, such as a mobile computing device and/or an electronic touch screen.

Further disclosed herein is a method of manufacturing a gesture sensor module, the method comprising: providing a package having first and second cavities; disposing an ASIC die and an optical sensor die in the first cavity; disposing an optical emitter die in the second cavity.

In some embodiments, an optical barrier can be disposed between the first and second cavities. In some embodiments, disposing the ASIC die and the optical sensor die can be performed before disposing the optical emitter die. In some embodiments, disposing the ASIC die and optical sensor die and disposing the optical emitter die can comprise arranging the optical sensor die such that an upper surface of the optical sensor die is higher than an emitter surface of the optical emitter die. In some embodiments, the method can further comprise disposing optical encapsulant in at least one of the first and second cavities. In some embodiments the cavities can be defined by first applying an optical encapsulant over the emitter die and the optical sensor die, and subsequently applying opaque molding material over the optical encapsulant. In some embodiments, the method can further comprise disposing a laminate cover over the package. In some embodiments, disposing the ASIC die and the optical sensor die can comprise arranging the optical sensor die on top of the ASIC die.

BRIEF DESCRIPTION OF THE DRAWINGS

The invention and various embodiments and features may be better understood by reference to the following drawings in which:

FIGS. 2A and 2B are schematic side and bottom views, respectively, of another embodiment of a gesture sensor module including a ceramic or pre-molded plastic package.

FIGS. 3A and 3B are schematic side cross section and top plan views, respectively, of a gesture sensor module incorporating a molded lead frame.

FIG. 4 is a schematic cross section of a gesture sensor module with a paddle upset for die stacking.

DETAILED DESCRIPTION

Figure 1:
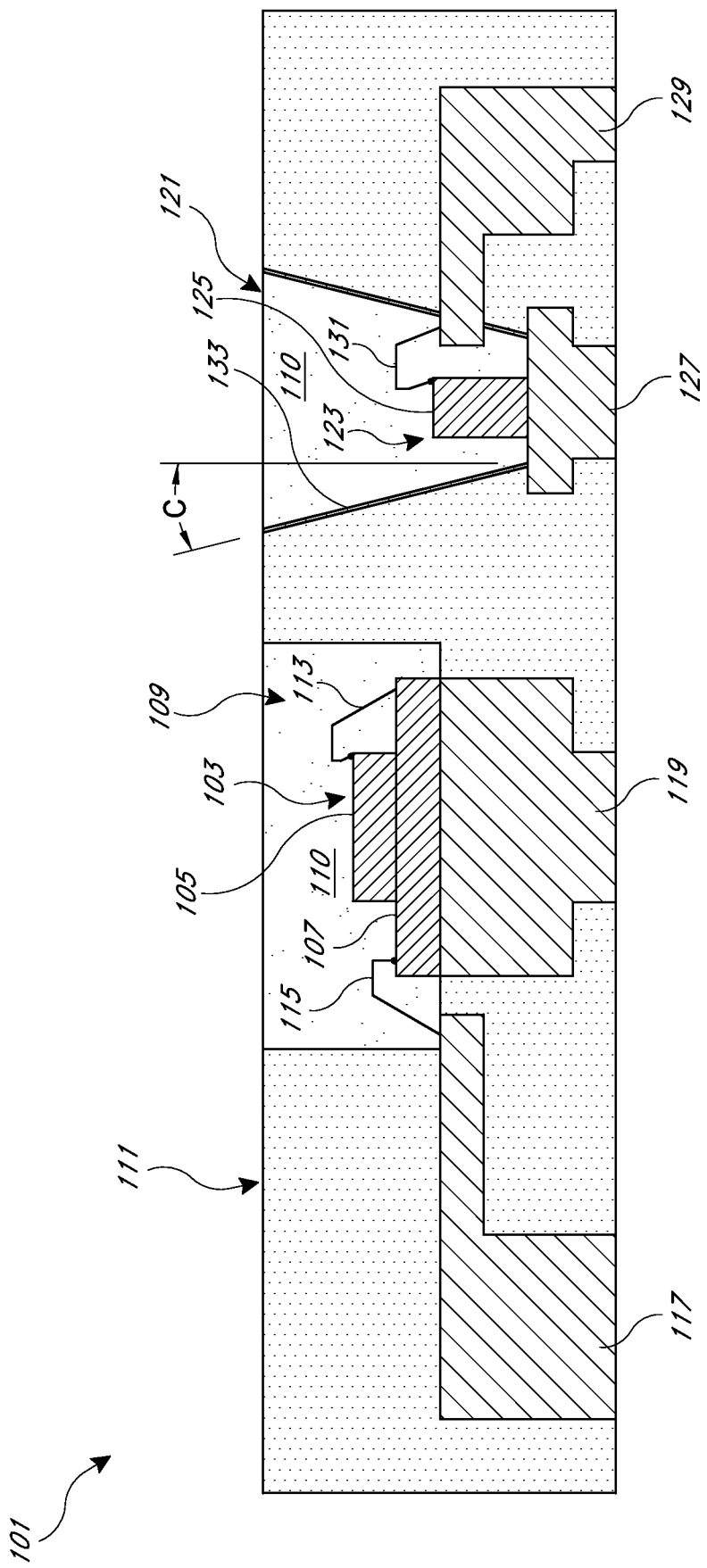
FIG. 1 is a schematic elevational cross section of a gesture sensor module, according to one embodiment.

The following detail description of certain embodiments presents various descriptions of specific embodiments of the invention. However, the invention can be embodied in myriad different ways as defined and covered by the claims. In this description, reference is made to the drawings in which like reference numerals indicate identical or functionally similar elements.

As used herein, directional terms such as "over," "under," "above," "below," "top," "bottom," etc. are intended to indicate relative positioning of the identified components. Such terms are not intended to reference absolute positioning. Accordingly, the entire system can be oriented in any direction, either during manufacturing or in use. The description and claims may refer to elements or features as being "mounted" or "attached" together. As used herein, unless expressly stated otherwise, "mounted" means that one element/feature is directly or indirectly connected to another element/feature. Likewise, unless expressly stated otherwise, "attached" means that one element/feature is directly or indirectly coupled to another element/feature, such as adhesive layers. Thus, although the various schematics shown in the figures depict example arrangements of elements and components, additional intervening elements, devices, features, or components may be present in an actual embodiment. Likewise, "adjacent" means that one element/feature is arranged next to another element/feature, but does not require direct connection or contact between the two.

FIG. 1 is a schematic elevational cross section of a gesture sensor module, according to one embodiment. The gesture sensor module 101 includes an optical sensor die 103 with an optical sensor surface 105. The optical sensor die 103 can be formed in a semiconductor material, such as a diced portion of a silicon wafer. The optical sensor surface 105 can be passivated to protect against corrosion. For example, a polyimide layer or a silicon polyimide layer can be provided over the optical sensor surface 105. In some embodiments, the polyimide layer can be applied at the wafer level, prior to singulation of a wafer into the plurality of individual optical sensor dies 103. An application-specific integrated circuit (ASIC) die 107 is disposed beneath the optical sensor die 103. In other embodiments, the ASIC die can be positioned laterally adjacent the optical sensor die, or can be positioned on top of the ASIC die, with a hole formed through the ASIC to allow light to pass therethrough to reach the optical sensor die. The illustrated stacked arrangement, however, can enhance a height differential between the optical sensor surface 105 and an emitter surface. The ASIC die 107 can be formed in a semiconductor material, such as silicon and can include various embedded passive electronic components (e.g., resistors, capacitors, inductors). In some embodiments, various passive electronic components can be attached to a separate packaging substrate and electrically interconnected to the ASIC die. In various embodiments, the ASIC die 107 can range in size from, e.g., about one millimeter across to about five millimeters across. The ASIC die 107 is typically an integrated circuit performing any number of processing functions, depending on the specific application. For example, in various embodiments the ASIC die 107 can include an amplifier, an analog-to-digital converter, and/or a microcontroller processor.

As illustrated, the optical sensor die 103 and ASIC die 107 are disposed in a first cavity 109 of the package body 111. Bond wires 113 provide electrical connection between the optical sensor die 103 and ASIC die 107, while bond wires 115 between the ASIC die 107 and leads 117, e.g., of a molded lead frame. In other embodiments, flip-chip connection, through silicon vias and solder bumps or other electrical interconnection methods may be used in lieu of bond wires to electrically connect the dies to the package leads. The ASIC die 107 is mounted onto die attach pad 119. The package body 111 can take the form of a pre-molded lead frame (as illustrated) or ceramic package, having cavities defined therein including first cavity 109 and second cavity 121.

Within the second cavity 121, an optical emitter die 123 having an emitter surface 125 is mounted onto a second die attach pad 127 of the lead frame. Optical emitter die 123 can be, for example, an LED emitter. The optical emitter die 123 is attached to leads 129 via bond wires 131. In the illustrated embodiment, the second cavity 121 is shaped conically, such that the opening of the second cavity 121 increases with distance from the second die attach pad 127. The angle C of the sidewalls of the second cavity 121, relative to the emission axis of the optical emitter die 123, can range from about 1 to about 30 degrees, in various embodiments. In other embodiments, the angle C can be from about 0° to about 30° The second cavity 121 can be lined with reflective coating 133. The reflective coating 133 can include, for example a metallic layer deposited (e.g., plated or sputtered) over the walls of the second cavity 121. An optical encapsulant 110 fills in the first and second cavities 109 and 121. In other embodiments, the second cavity can assume different shapes—for example the walls may be stepped or curved. In still other embodiments, the walls of the second cavity may be vertical, such that the width of the second cavity is substantially uniform along its entire height.

In use, light from the optical emitter die 123 is directed out of the gesture sensor module 101 through the opening in the second cavity 121. The conical shape and reflective coating 133 can increase both the amount of light exiting the second cavity 121 and the angle of distribution outside the package body 111. The emitted light is reflected from objects at some distance from the gesture sensor module 101, for example a user's hand performing a gesture. The reflected light can be detected by the optical sensor die 103 in the first cavity 109. To assist in detection of reflected light, and thereby detection of performed gestures, the optical sensor die 103 and the optical emitter die 123 can be optically isolated from one another. By placing these two dies in separate cavities 109 and 121, separated by the opaque molding compound or ceramic material of the package body 111, the risk of light pollution or cross-talk directly between the optical sensor die 103 and the optical emitter die 123, without an intervening external object or motion, can be reduced. In other embodiments, as described in more detail below, the molding compound or ceramic material may be replaced or augmented with other optical barriers to prevent cross-talk.

In various embodiments, a cover glass (not shown) may be provided to define an upper or forward surface of the gesture sensor module 101, such that light emitted from the optical emitter die 123 passes through the cover glass, and similarly light reflected from an object passes through the cover glass before reaching the optical sensor die 103. Depending on the position of the cover glass, its thickness, and material composition, there is some risk that light emitted from the optical emitter 123 may reflect off an outer surface of the cover glass and be redirected to the optical sensor die 103 without exiting the cover glass and being reflected off an external object. Such cross-talk can deleteriously affect the performance of the gesture sensor module 101. By varying certain design parameters of the package 111, and first and second cavities 109 and 121, the risk of such cross-talk can be reduced. For example, the conical shape of the second cavity 121 and its reflective coating 133 can reduce the risk of cross-talk. Additionally, such cross-talk can be reduced by positioning the optical sensor 103 such that the upper surface 105 is elevated relative to the upper surface 125 of the optical emitter die 123. The difference in height between the sensing surface 105 and the emitting surface 125 may vary in different embodiments.

Elevating the sensor surface 105 can also increase the sensitivity of the optical sensor die 103, independently of the position of the optical emitter die 123. Accordingly, there are advantages both to elevating the optical sensor die 103 and to relatively lowering the optical emitter die 123. In various embodiments, the height difference between the sensor surface and the emitter surface may be between about 0.1 mm and about 0.9 mm. In some embodiments, for example, the height difference may be between about 0.25 mm and about 0.75 mm. A wide variety of approaches may be employed for raising the height of the sensor surface 105 with respect to the emitter surface 125. In some embodiments, the ASIC on which the sensor is positioned can be made more or less thick to achieve the desired vertical positioning of the sensor surface. Similarly, the thickness of the sensor die itself and/or the thickness of the emitter die can be controlled to achieve the desired relative heights. The package itself may also be configured to contribute to the desired height differential—for example the first and second cavities can have different depths (die pads 119 and 127 can have different heights, as shown). In some embodiments, the sensor and/or ASIC can be positioned on another component so as to raise the height of the sensor surface. For example, a heat slug may be provided beneath the ASIC both for its thermal management properties and also to raise the height of the sensor. Various other techniques are possible.

The total height of the module 101 can vary. In some embodiments, the total height can be between about 1.0 and 1.4 mm, in some embodiments between about 1.15 mm and 1.25 mm. The relative height of the package, relative to the dies, permits recessing the emitter surface 325 by, e.g., between about 0.7 mm and 1.1 mm from the top of the module 301, while the sensor surface 305 can be significantly closer to the top of the module, e.g. between about 0.2 mm and 1.0 mm from the top of the module 301. This differential can aid in minimize "pollution" or cross-talk from the emitter 323 to the sensor 303.

The lateral distance between the center of the optical emitter die 123 and the center of the optical sensor die 103 can vary to achieve reduced cross-talk. In various embodiments, this lateral distance can be between about 0.25 mm to about 3 mm, for example between about 0.5 mm and about 2 mm. In some embodiments, this lateral distance can be at least 2 mm.

The design of the package, the relative heights of the emitter surface and the sensor surface, and the lateral spacing between the center of the optical sensor die and the center of the optical emitter die can all contribute to reduced cross-talk between the sensor and the emitter. In some embodiments, the module is configured such that less than about 5% of light emitted from the emitter surface is reflected from the cover glass to the sensor surface.

FIGS. 2A and 2B are schematic side cross section and top plan views, respectively, of another embodiment of a gesture sensor module assembly. Similar to the embodiment illustrated in FIG. 1, a gesture sensor module 201 includes a package body 211 having first and second cavities 209 and 221. The package body 211 may be ceramic or pre-molded lead frame. The first cavity 209 includes an ASIC die 207, over which is positioned an optical sensor die 203 having an upper sensor surface 205. Bond wires 215 connect the ASIC die 207 to the leads 217, while bond wires 213 connect the optical sensor die 203 to the ASIC die 207. In other embodiments, flip-chip connection, through silicon vias and solder bumps or other electrical interconnection methods may be used in lieu of bond wires to electrically connect the dies to the package leads. A low-stress die attach adhesive 218 may be disposed between the optical sensor die 203 and the ASIC die 207, as well as between the ASIC die 207 and the bottom of the first cavity 209.

The second cavity 221 includes an optical emitter die 223 having an emitter surface 225. The optical emitter die 223 is mounted onto a die attach pad 227, and electrically connected to leads 229 via bond wire 231. The walls of the second cavity 221 are coated with a reflective coating 233, and are oriented with a slanted surface, creating a funnel or conical shape. The angle C' of the walls with respect to the emission axis can vary, for example between 1 and 30 degrees, in some embodiments, or between 0° and 30° in other embodiments. An optical encapsulant 210 fills in the first and second cavities 209 and 221.

As illustrated, the height of the mold platform on which the ASIC die 207 is mounted can be elevated with respect to the bottom of the second cavity 221. In addition to the thickness of the ASIC die 207, this results in the height of the sensor surface 205 being elevated with respect to the emitter surface 223. As noted above, this height differential can increase sensitivity of the sensor while decreasing cross-talk between the sensor and emitter.

FIGS. 3A and 3B are schematic side cross section and top plan views, respectively, of a gesture sensor module incorporating a molded lead frame in accordance with another embodiment. This embodiment is similar to that described above with respect to FIGS. 2A and 2B, except that the lead frame is provided with leads around all four sides of the ASIC die 307 and optical sensor die 303, and the leads extend on three sides to the edges of the package body 311. Similar to the embodiments above, a gesture sensor module 301 includes a package body 311 having first and second cavities 309 and 321. The package body 311 may be ceramic or plastic. The first cavity 309 includes an ASIC die 307, over which is positioned an optical sensor die 303 having an upper sensor surface 305. Bond wires 315 connect the ASIC die 307 to leads 317, while bond wires 313 connect the optical sensor die 303 to the ASIC die 307. In other embodiments, flip-chip connection, through silicon vias or other electrical interconnection methods may be used in lieu of bond wires to electrically connect the dies to the package leads. A low-stress die attach adhesive 318 may be disposed between the optical sensor die 303 and the ASIC die 307, as well as between the ASIC die 307 and the bottom of the first cavity 309.

The second cavity 321 includes an optical emitter die 323 having an emitter surface 325. The optical emitter die 323 is mounted onto a die attach pad 327, and electrically connected to leads 329 via bond wires 331. The walls of the second cavity 321 are coated with a reflective coating 333, and are oriented with a slanted surface, creating a funnel or conical shape. The angle C'' of the walls, relative to the emission axis, can vary, for example between 1 and 30 degrees, in some embodiments, or between about 0° and 30° in other embodiments. An optical encapsulant 310 fills in the first and second cavities 309 and 321.

As illustrated, the height of the mold platform on which the ASIC die 307 is mounted can be elevated with respect to the bottom of the second cavity 321. In addition to the thickness of the ASIC die 307, this results in the height of the sensor surface 305 being elevated with respect to the emitter surface 323. As noted above, this height differential can increase sensitivity of the sensor while decreasing cross-talk between the sensor and emitter. The relative height of the package, relative to the dies, permits recessing the emitter surface 325 by, e.g., between about 0.7 mm and 1.1 mm from the top of the module 301, while the sensor surface 305 can be significantly closer to the top of the module, e.g. between about 0.2 mm and 1.0 mm from the top of the module 301.

FIG. 4 is a schematic illustration of a gesture sensor module with a paddle that is embedded above the bottom surface of the package body 411 ("upset" die paddle) for die stacking. This embodiment is similar to that described above with respect to FIG. 2A, with the addition of the embedded die paddle 419 on which the stacked ASIC die 407 and optical sensor die 403 are positioned. Similar to the embodiments above, a gesture sensor module 401 includes a package body 411 having first and second cavities 409 and 421. The package body 411 may be ceramic or pre-molded plastic. The first cavity 409 includes an ASIC die 407, over which is positioned an optical sensor die 403 having an upper sensor surface 405. Bond wires 415 connect the ASIC die 407 to the lead frame 417, while bond wires 413 connect the optical sensor die 403 to the ASIC die 407. In other embodiments, flip-chip connection or other electrical interconnection methods may be used in lieu of bond wires. A low-stress die attach adhesive 418 may be disposed between the optical sensor die 403 and the ASIC die 407, as well as between the ASIC die 407 and the bottom of the first cavity 409.

The second cavity 421 includes an optical emitter die 423 having an emitter surface 425. The optical emitter die 423 is mounted onto die attach pad 427, and electrically connected to lead frame 429 via bond wire 431. The walls of the second cavity 421 are coated with a reflective coating 433, and are oriented with a slanted surface, creating a funnel or conical shape. The angle C''' of the walls, relative to the emitter axis, can vary, for example between 1 and 30 degrees, in some embodiments, or between about 0° and 30° in other embodiments. An optical encapsulant 410 fills in the first and second cavities 409 and 421.

As illustrated, the height of the mold platform on which the ASIC die 407 is mounted can be elevated with respect to the bottom of the second cavity 421, which is defined by the upper surface of the die attach pad 427 in the illustrated embodiment. In addition to the thickness of the ASIC die 407, this results in the height of the sensor surface 405 being elevated with respect to the emitter surface 423. As noted above, this height differential can increase sensitivity of the sensor while decreasing cross-talk between the sensor and emitter.

Figure 5:
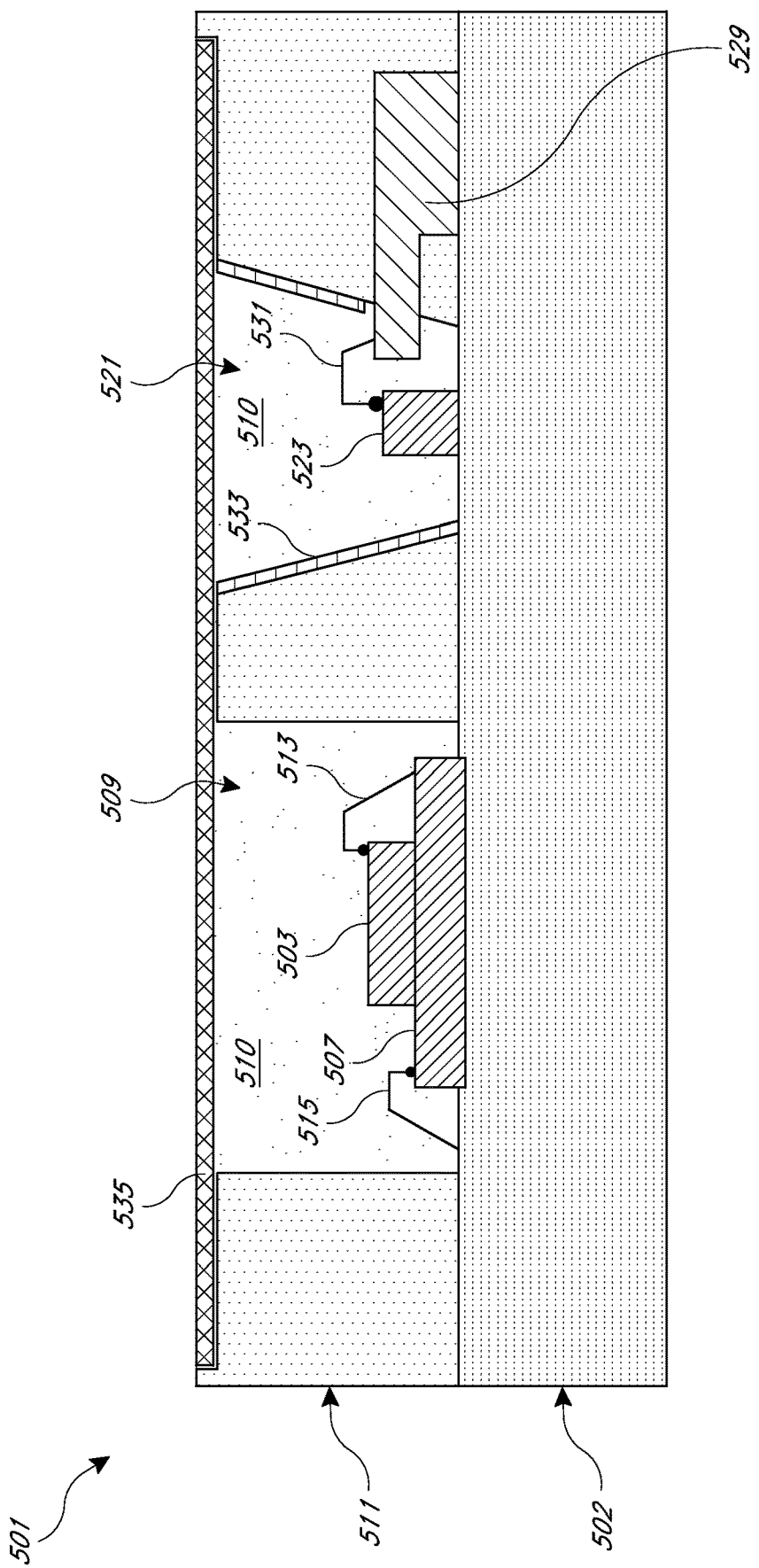
FIG. 5 is a schematic cross section of a gesture sensor module including a laminate substrate and a pre-molded package body.

The embodiments described above with respect to FIGS. 1-4 incorporate ceramic or pre-molded plastic packages. However, other embodiments may use laminate substrates with pre-molded package bodies laminated on a package substrate (which can be a PCB or premolded lead frame, for example). FIG. 5 is a schematic illustration of a gesture sensor module 501 including a laminate substrate and a pre-molded package body 511. The gesture sensor module 501 includes a laminate substrate 502, on which an ASIC die 507 is disposed, with an optical sensor die 503 stacked on top of the ASIC die 507. Bond wires 515 connect the ASIC die 507 to bond pads on the laminate substrate 502, while bond wires 513 connect the optical sensor die 503 to the ASIC die 507. In other embodiments, flip-chip connection, through silicon vias or other electrical interconnection methods may be used. An optical emitter die 523 is disposed on the laminate substrate 502 at a distance spaced apart from the ASIC die 507. The optical emitter die 523 is shown electrically connected to a bonding shelf 529 that is embedded in the package body 511 via bond wire 531. In other embodiments, the optical emitter die can be electrically connected to the laminate substrate directly, and the bonding shelf may be omitted.

The pre-molded package body 511 can be positioned over the laminate substrate 502. The pre-molded package body 511 includes first cavity 509 which are configured to receive the stacked ASIC die 507 and optical sensor die 503, and a second cavity 521 which is configured to receive the optical emitter die 523. The walls of the second cavity 521 are coated with a reflective coating 533, and are oriented with a slanted surface, creating a funnel or conical shape. The angle of the walls, relative to the emitter axis, can vary, for example between about 1 and 30 degrees, in some embodiments, and between about 0° and 30° in other embodiments. An outer cover 535 can be disposed over the pre-molded cover 511. The outer cover 535 can be, for example, glass or other optically transmissive material. The first and second cavities 509 and 521 may be filled with clear optical encapsulant 510 prior to attaching the outer cover 535. While not illustrated, similar glass or other transmissive covers or can also be provided over the modules of FIGS. 1-4.

Figure 6:
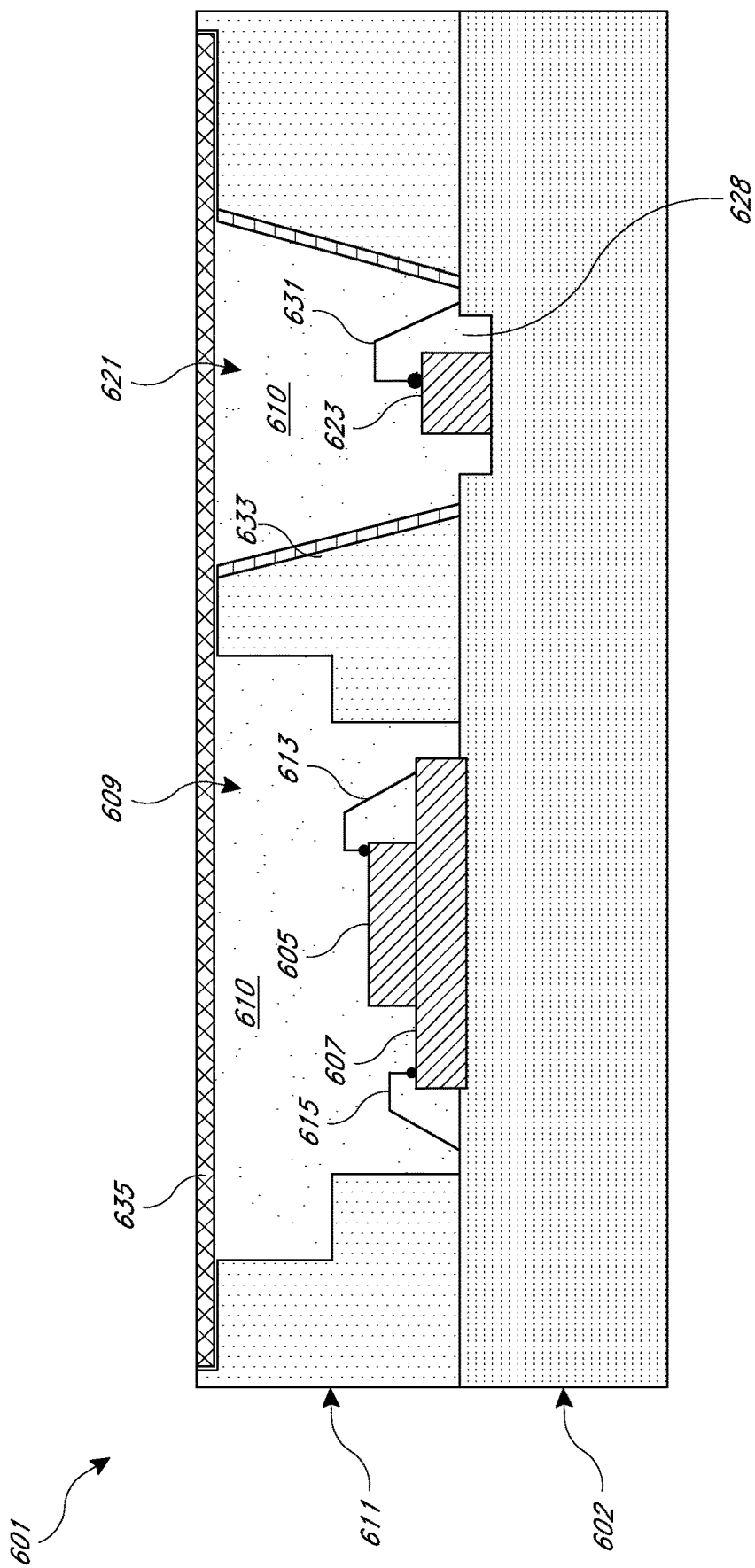
FIG. 6 is a schematic cross section of another embodiment of a gesture sensor module including a laminate substrate and pre-molded package body.

FIG. 6 is a schematic illustration of another embodiment of a gesture sensor module 601 including a laminate substrate 602 and pre-molded package body 611. The illustrated embodiment is similar to that of FIG. 6, except that the bonding shelf is omitted, and the optical emitter die is disposed in a recess in the laminate substrate 602. An ASIC die 607 is disposed on the laminate substrate 602, with an optical sensor die 603 stacked on top of the ASIC die 607. Bond wires 615 connect the ASIC die 607 to the laminate substrate 602, while bond wires 613 connect the optical sensor die 603 to the ASIC die 607. An optical emitter die 623 is disposed on the laminate substrate 602 at a distance spaced apart from the ASIC die 607. The optical emitter die 623 is electrically connected to the laminate substrate 602 via bond wire 631. In other embodiments, flip-chip connection or other electrical interconnection methods may be used in place of the bond wires.

The pre-molded package body 611 is positioned over the substrate 602. The pre-molded package body 611 includes first cavity 609 which are configured to receive the stacked ASIC die 607 and optical sensor die 603, and a second cavity 621 which is configured to receive the optical emitter die 623. The walls of the second cavity 621 are coated with a reflective coating 633, and are oriented with a slanted surface, creating a funnel or conical shape. The angle of the walls, relative to the emitter axis, can vary, for example between 1 and 30 degrees, in some embodiments, or between about 0° and 30° in other embodiments. A lid or outer cover 635 can be disposed over the pre-molded cover 611. The first and second cavities 609 and 621 may be filled with clear optical encapsulant 610 prior to attaching the outer cover 635.

As illustrated, the optical emitter die 623 is disposed in a recess 628 in the laminate substrate 602. As a result, upper surface of the optical emitter die 623 is lower than the upper surface of the optical sensor die 605. As noted above, the resultant height differential, with the surface of the sensor 605 closer to the upper surface of the module 601 compared to the surface of the emitter 623, can increase decrease cross-talk between the sensor and emitter.

Figure 7:
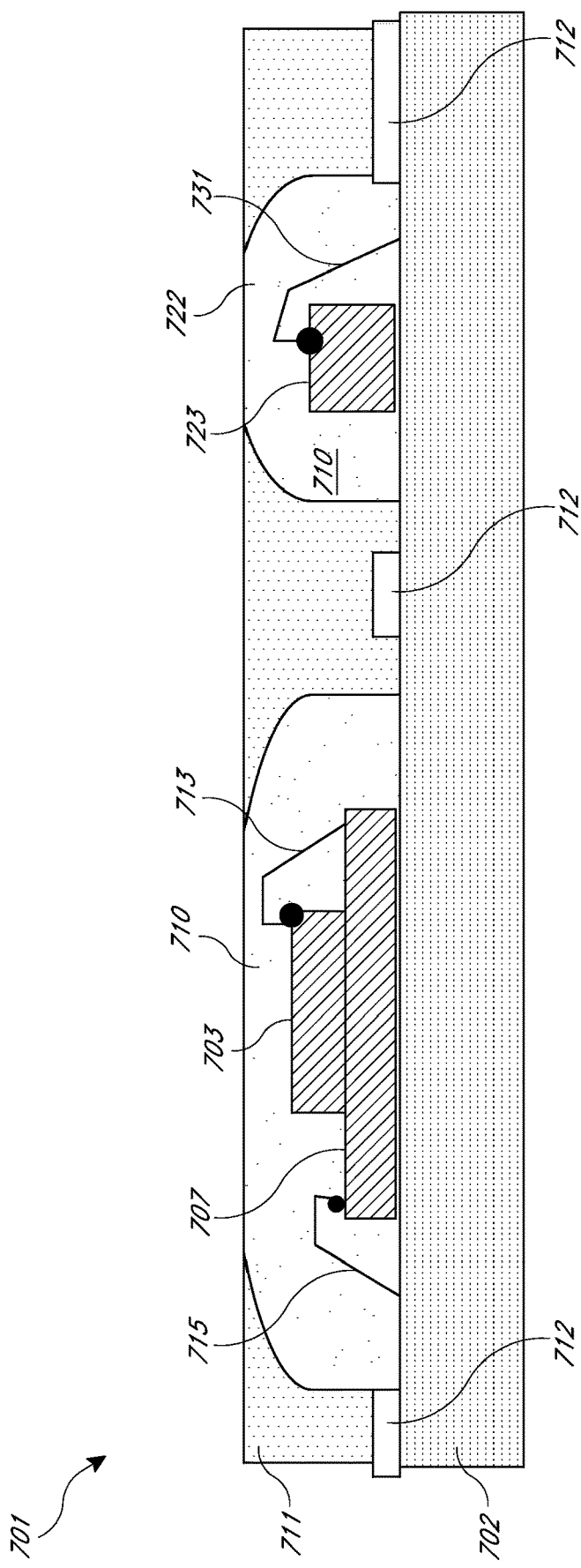
FIG. 7 is a schematic cross section of a gesture sensor module having a laminate substrate with an optical encapsulant and a molding compound disposed thereover.

In addition to the embodiments described above, other embodiments may include a laminar substrate or molded lead frame on which various dies are placed, followed by placing molding compound, a laminate cover, or pre-molded plastic cover thereover. In embodiments using laminate or pre-molded package body, an optical barrier such as metallized vias can be disposed between the optical sensor die and the optical emitter die to avoid cross-talk. FIG. 7 is a schematic illustration of a gesture sensor module having a laminate substrate 702 and molding compound deposited thereover. As illustrated, the gesture sensor module 701 includes a laminate substrate 702, on which an ASIC die 707 is disposed, with an optical sensor die 703 stacked on top of the ASIC die 707. Bond wires 715 connect the ASIC die 707 to the laminate substrate 702, while bond wires 713 connect the optical sensor die 703 to the ASIC die 707. An optical emitter die 723 is disposed on the laminate substrate 702 at a distance spaced apart from the ASIC die 707. The optical emitter die 723 is electrically connected to the laminate substrate 702 via bond wire 731. In other embodiments, flip-chip connection, through silicon vias or other electrical interconnection methods may be used in place of the bond wires.

A first optical encapsulant 710 is disposed on top of and/or surrounding the stacked ASIC die 707 and optical sensor die 703. A second optical encapsulant 722 is disposed on top of and/or surrounding the optical emitter die 723. In some embodiments, optical encapsulant may be deposited over both of the stacked ASIC die 707 and optical sensor die 703 and the optical emitter die 722, after which the two may be separated by removing a portion of intervening optical encapsulant, for example by grinding, saw, or laser. In other embodiments, the optical encapsulant 710 and 722 may be deposited separately, and encapsulant-arresting features 712 may be disposed on the laminate substrate to keep the separate optical encapsulants 710 and 722 from joining one another. The encapsulant-arresting features 712 may be, for example a thick soldermask. Once the separate optical encapsulants 710 and 722 are positioned over the optical sensor die 713 and optical emitter die 723, and cured, the molding compound 711 may be deposited thereover. The opaque molding compound 711 positioned laterally between the optical sensor die 703 and the optical emitter die 723 serves as an optical barrier, reducing the potential for cross-talk. Following placement of the molding compound, the top surface may then be removed (e.g., by grinding) until the optical encapsulants 710 and 722 are exposed to the upper surface, allowing for light to communicate between outside the module 701 and the optical sensor die 703 and optical emitter die 723.

In alternative embodiments, the laminate substrate may be replaced with a lead frame strip or molded lead frame. The stacked ASIC die and optical sensor die, as well as the optical emitter die, may be mounted onto the lead frame. Optical encapsulant may then be deposited over the mounted dies, followed by placement of the molding compound. The top surface is then removed, providing for an optical path between the optical sensor die and the top surface, as well as between the optical emitter die and the top surface.

Figure 8:
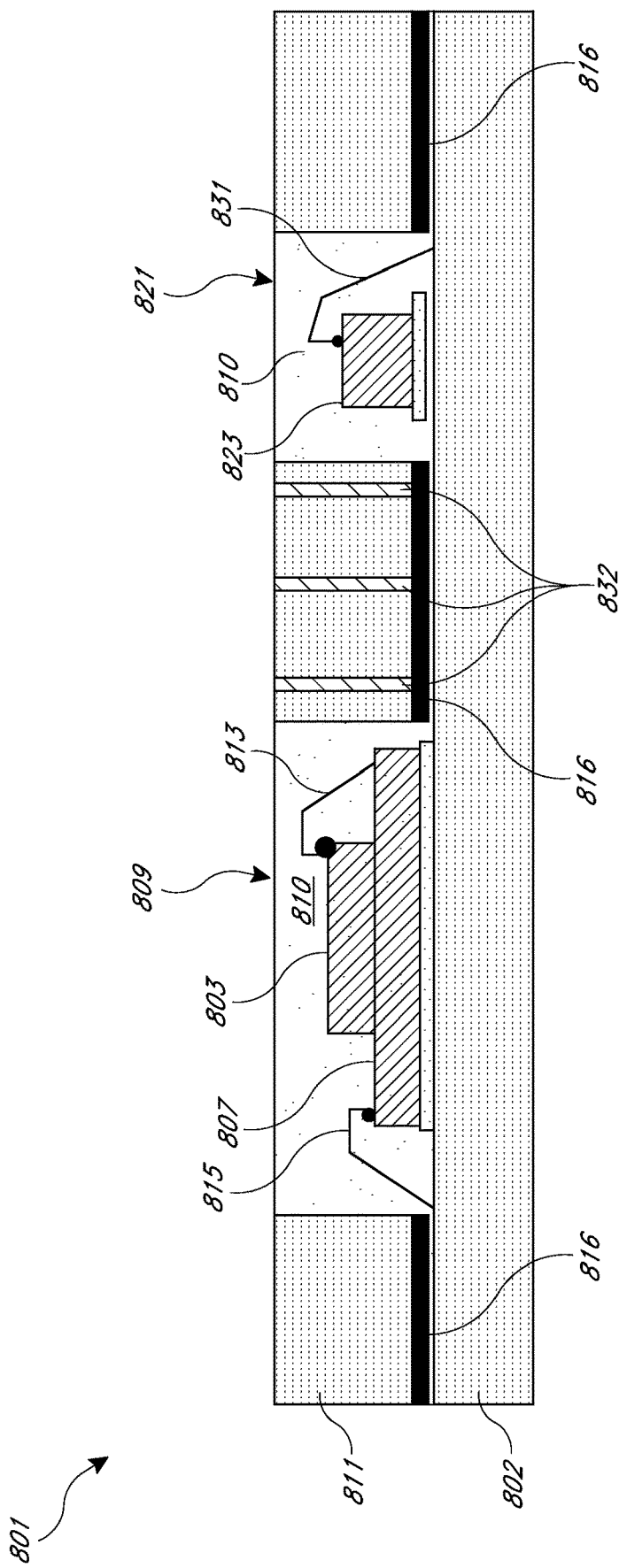
FIG. 8 is a schematic cross section of a gesture sensor module having a laminate substrate and a laminate or pre-molded plastic package body disposed thereover.

FIG. 8 is a schematic illustration of a gesture sensor module 801 having a laminate substrate 802 and laminate package body 811 with metallized vias. As illustrated, the gesture sensor module 801 includes a laminate substrate 802, on which an ASIC die 807 is disposed, with an optical sensor die 803 stacked on top of the ASIC die 807. Bond wires 815 connect the ASIC die 807 to the laminate substrate 802, while bond wires 813 connect the optical sensor die 803 to the ASIC die 807. An optical emitter die 823 is disposed on the laminate substrate 802 at a distance spaced apart from the ASIC die 807. The optical emitter die 823 is electrically connected to the laminate substrate 802 via bond wire 831. In other embodiments, flip-chip connection, through silicon vias or other electrical interconnection methods may be used in place of the bond wires.

A laminate or pre-molded plastic package body 811, having pre-selected holes defining first and second cavities 809 and 821, is then placed over the laminate substrate 802, and attached with adhesive 816. Optical encapsulant 810 may then be placed into the first and second cavities 809 and 821. As illustrated, the laminate or pre-molded plastic package body 811 may include a plurality of metallized vias 832 vertically oriented and positioned laterally between the first and second cavities 809 and 821. These metallized vias 832 can serve as an optical barrier, ensuring that light from the optical emitter die 823 does not pass laterally through the laminate or pre-molded plastic package body 811 from the second cavity 821 and into the first cavity 809. By reducing the potential for cross-talk, these metallized vias provide an optical barrier and improve performance of the gesture sensor module.

In alternative embodiments, the laminate substrate may be replaced with a lead frame strip or molded lead frame. The stacked ASIC die and optical sensor die, as well as the optical emitter die, may be mounted onto the lead frame. The laminate or pre-molded package body may then be placed over the lead frame. Optical encapsulant may then be filled into the holes in the laminate or pre-molded package body, providing for an optical path between the optical sensor die and the top surface, as well as between the optical emitter die and the top surface.

Figure 9:
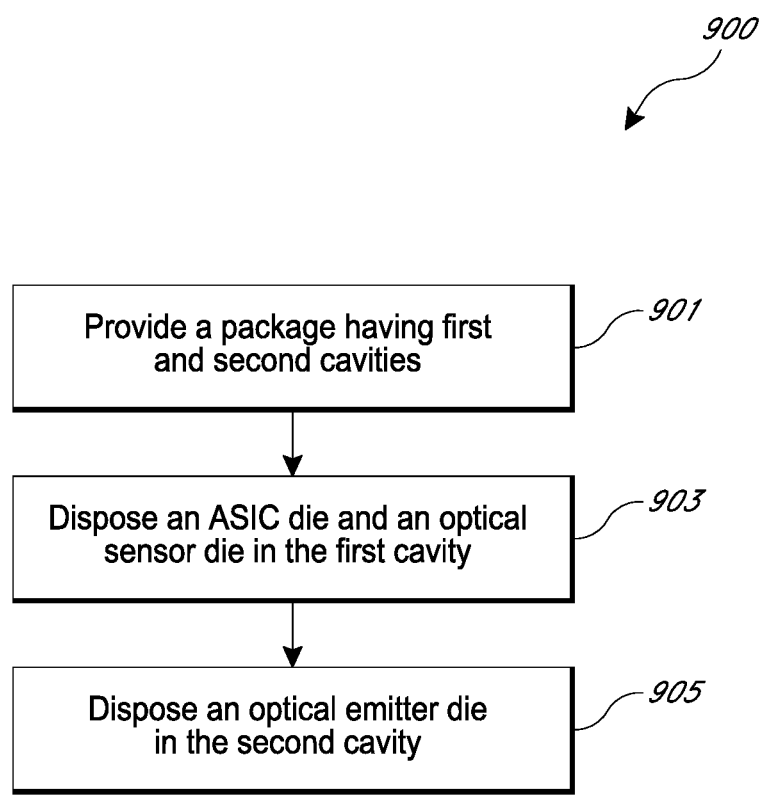
FIG. 9 is a flow chart illustrating a method for manufacturing a gesture sensor module, according to an embodiment.

FIG. 9 is a flow chart illustrating a method for manufacturing a gesture sensor module, according to an embodiment. Process 900 begins in block 901 with providing a package having first and second cavities. As described above, in various embodiments the package may take the form of a ceramic or pre-molded package, a laminate substrate, or a lead frame molded package. In some embodiments, the cavity may only be defined after depositing molding compound, or attaching a cover to a substrate. The process 900 continues in block 903 with disposing an ASIC die and an optical sensor die in the first cavity. In block 905, an LED emitter is disposed in the second cavity. An optical barrier may be disposed between the first cavity and the second cavity, to reduce the risk of cross-talk between the optical emitter die and the optical sensor die. In various embodiments, one or both of the cavities may be filled with optical encapsulant. As described above, the package, ASIC die, optical sensor die, and emitter may be configured such that an upper emitter surface is lower than an upper sensor surface. This elevation difference can increase sensitivity of the optical sensor while reducing cross-talk between the optical sensor and the emitter. Additionally, the second cavity, which houses the emitter, can be provided with sloping sidewalls optionally coated with a reflective coating. These attributes can also contribute to reduced cross-talk, while improving the efficient utilization of emitted light. Various other modifications are possible.

In some embodiments (for example, the embodiments illustrated in FIGS. 1-4), the manufacturing process can begin with a pre-molded cavity lead frame package. The package is provided with first and second cavities. A stacked ASIC die and optical sensor die are mounted in the first cavity, and the optical emitter die is mounted in the second cavity. Bond wires can be formed to provide the electrical interconnections, though as noted above other methods (e.g., flip-chip) may be used. Next, the first and second cavities can be filled with optical encapsulant. The module may then be marked, covered in protective covertape as needed, taped, reeled, and shipped.

In some embodiments (for example, the embodiments illustrated in FIGS. 5 and 6), the manufacturing process can begin with a laminate substrate. A stacked ASIC die and optical sensor die are attached at a first location, and an optical emitter die is attached at a second location. Bond wires can be formed to provide the required electrical interconnections, or other alternative electrical interconnection methods may be used. A pre-molded cover can be attached to the laminate substrate, the pre-molded cover defining first and second cavities such that the stacked ASIC die and optical sensor die are disposed in the first cavity, and the optical emitter die is disposed in the second cavity. Each of the cavities may then be filled with optical encapsulant, followed by mounting an outer cover (e.g., glass) over the top surface of the pre-molded cover. The package can then be singulated, taped, reeled, and shipped.

In some embodiments (for example, the embodiment illustrated in FIG. 7), the manufacturing process can begin with a laminate substrate or lead frame strip. A stacked ASIC die and optical sensor die are attached at a first location, and an optical emitter die is attached at a second location. Bond wires can be formed to provide the required electrical interconnections, or other techniques for providing electrical connection may be used. Optical encapsulant may then be deposited over each of the stacked ASIC die/optical sensor die and over the optical emitter die. The two deposits of optical encapsulant can be kept separate, for example by use of an encapsulant-arresting feature such as a soldermask or a half-etch in a lead frame. If needed, the optical encapsulant over the stacked ASIC die/optical sensor die and the optical encapsulant the optical emitter die can be separated, for example by grinding, saw, or laser. Molding compound may then be deposited over the substrate and optical encapsulants, followed by removing a portion of the molding compound to expose the optical encapsulants to an upper surface of the package. The package can then be singulated, taped, reeled, and shipped.

In some embodiments (for example, the embodiment illustrated in FIG. 8), the manufacturing process can begin with a laminate substrate or lead frame strip. A stacked ASIC die and optical sensor die are attached at a first location, and an optical emitter die is attached at a second location. Bond wires or other approaches can provide the required electrical interconnections, or techniques for providing electrical connection may be used. A laminate or pre-molded cover having pre-defined cavities may then be attached to the laminate substrate or lead frame strip, such that the stacked ASIC die and optical sensor die are disposed in a first cavity and the optical emitter die is disposed in a second cavity. Between the two cavities, the laminate or pre-molded cover can include an optical barrier such as a plurality of metalized vias. Each of the first and second cavities can then be filled with optical encapsulant. The package may then be singulated, taped, reeled, and shipped.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A gesture sensor module comprising:
   an optical emitter die having an emitter surface, the optical emitter die mounted on a first mounting surface;
   an optical sensor die having a sensor surface facing upwards, the optical sensor die mounted on a second mounting surface; and
   a package housing the optical emitter die disposed in a first cavity of the package and the optical sensor die disposed in a second cavity of the package, wherein the first mounting surface is disposed at a first height relative to a bottom surface of the package, the second mounting surface is disposed at a second height relative to the bottom surface of the package, wherein the first height is different from the second height, and wherein a portion of an external surface of the package defines a surface for detecting a gesture by the optical sensor die; and
   an Application Specific Integrated Circuit (ASIC) die, the optical sensor die stacked on the ASIC die such that the ASIC die is disposed between the optical sensor die and the bottom surface of the package, the ASIC die in electrical communication with the optical sensor die.

2. The gesture sensor module of claim 1, wherein the first height is less than the second height and the sensor surface is higher than the emitter surface.

3. The gesture sensor module of claim 2, wherein an optical barrier is positioned laterally between the first and second cavities, the emitter surface, and the sensor surface are configured such that less than about 5% of light emitted from the emitter surface is reflected from a cover glass to the sensor surface.

4. The gesture sensor module of claim 3, wherein the emitter surface is between 0.25 mm and 0.75 mm farther from a top surface of the package than the sensor surface.

5. The gesture sensor module of claim 2, wherein the optical barrier slopes from the upper surface of the package substrate to a location at or near the portion of the external surface.

6. The gesture sensor module of claim 1, wherein the package comprises an opening over the emitter surface having a conical shape, such that a width of the opening increases with distance from the emitter surface.

7. The gesture sensor module of claim 6, wherein the surface of the opening is reflective.

8. The gesture sensor module of claim 6, wherein the opening defines a cone with walls defining an angle with the axis of the emitter of between about 1 and 30 degrees.

9. The gesture sensor module of claim 1, wherein the emitter surface is laterally spaced from the sensor surface by between about 0.25 mm and 3 mm.

10. The gesture sensor module of claim 1, wherein the ASIC die provides a height difference between the first height and the second height.

11. The gesture sensor module of claim 1, wherein the package comprises at least one of: laminate, ceramic, and pre-molded polymer.

12. The gesture sensor module of claim 1, wherein the total package height is between about 1 and 1.4 mm.

13. A mobile computing device comprising the gesture sensor module of claim 1.

14. A gesture sensor module comprising:
a package comprising first and second cavities;
an optical emitter die positioned in the first cavity;
an optical sensor die positioned in the second cavity;
an optical barrier positioned laterally between the optical emitter die and the optical sensor die;
a first support surface which supports the optical emitter die; and
a second support surface which supports the optical sensor die, wherein the first support surface is closer to a bottom surface of the package than the second support surface, wherein an emitter surface of the optical emitter die is lower than an upper surface of the optical sensor die, and wherein a portion of an external surface of the package defines a surface for detecting a gesture by the optical sensor die,
wherein the optical barrier tapers inwardly from a lower portion of the optical barrier to an upper portion of the optical barrier such that an uppermost portion of the first cavity is smaller than a lowermost portion of the first cavity.

15. The gesture sensor module of claim 14, wherein the package comprises a pre-molded or ceramic package, and wherein the optical barrier comprises a portion of the pre-molded or ceramic package.

16. The gesture sensor module of claim 14, wherein the optical barrier comprises a molding compound.

17. The gesture sensor module of claim 14, wherein the optical barrier comprises a metallized via in a laminate or pre-molded plastic cover.

18. A mobile computing device comprising the gesture sensor module of claim 14.

19. A method of manufacturing a gesture sensor module, the method comprising:
providing a package;
disposing an optical emitter die on a first mounting surface;
disposing an optical sensor die on a second mounting surface, wherein the first and second mounting surfaces are positioned at different heights relative to one another, the different heights provided at least in part by an Application Specific Integrated Circuit (ASIC) die disposed underneath the sensor die, and wherein a portion of an external surface of the package defines a surface for detecting a gesture by the optical sensor die; and
disposing an optical barrier between the optical sensor die and the optical emitter die and surrounding the optical emitter die.

20. The method of claim 19, wherein the package comprises first and second cavities, and wherein the optical sensor die is disposed in the first cavity, and the optical emitter die is disposed in the second cavity.

21. The method of claim 19, wherein disposing the optical sensor die and disposing the optical emitter die comprises arranging the optical sensor such that an upper surface of the optical sensor die is higher than an emitter surface of the optical emitter die and comprises arranging the optical emitter die and the optical sensor die such that a bottom surface of the optical sensor die is farther from a bottom surface of the package than a bottom surface of the optical emitter die.

22. The method of claim 19, further comprising disposing optical encapsulant in at least one of the first and second cavities.

23. The method of claim 19, further comprising disposing a laminate cover over the package.

24. The gesture sensor module of claim 1, wherein a bottom surface of the optical emitter die is lower than a bottom surface of the optical sensor die, and wherein the first mounting surface comprises a die attach pad and the second mounting surface comprises an upper surface of the ASIC die.

25. The gesture sensor module of claim 19, wherein the first mounting surface comprises a die attach pad and the second mounting surface comprises an upper surface of the ASIC die.

26. The gesture sensor module of claim 5, wherein the optical barrier vertically extends to the external surface of the package.

27. The gesture sensor module of claim 6, wherein an apex of the conical shape is proximate the first mounting surface.

28. The gesture sensor module of claim 14, wherein at least one of the first and second cavities is filled with an optical encapsulant.

29. The gesture sensor module of claim 1, wherein at least one of the first and second cavities is filled with an optical encapsulant.

30. The gesture sensor module of claim 5, further comprising a glass cover, the optical barrier extending from the upper surface to a lower surface of the glass cover.

31. The gesture sensor module of claim 1, wherein the package comprises a package substrate having an upper surface exposed to the first cavity.

32. The gesture sensor module of claim 19, wherein an opening defined by the optical barrier above the optical emitter die tapers inwardly towards the external surface.

33. The gesture sensor module of claim 1, further comprises an intervening adhesive between the optical sensor die and the ASIC die.

* * * * *